Nov. 2, 1965 K. L. FISHER 3,215,940

VOLUME COMPRESSION CIRCUITS

Filed May 27, 1963

Inventor
KEITH LOVETT FISHER
By
Browne, Schuyler + Beveridge
Attorney

United States Patent Office 3,215,940
Patented Nov. 2, 1965

3,215,940
VOLUME COMPRESSION CIRCUITS

Keith L. Fisher, Cambridge, England, assignor to Pye Limited, Cambridge, England Filed May 27, 1963, Ser. No. 283,480
Claims priority, application Great Britain, May 30, 1962, 20,734/62
1 Claim. (Cl. 330—3)

Figures 1, 2:
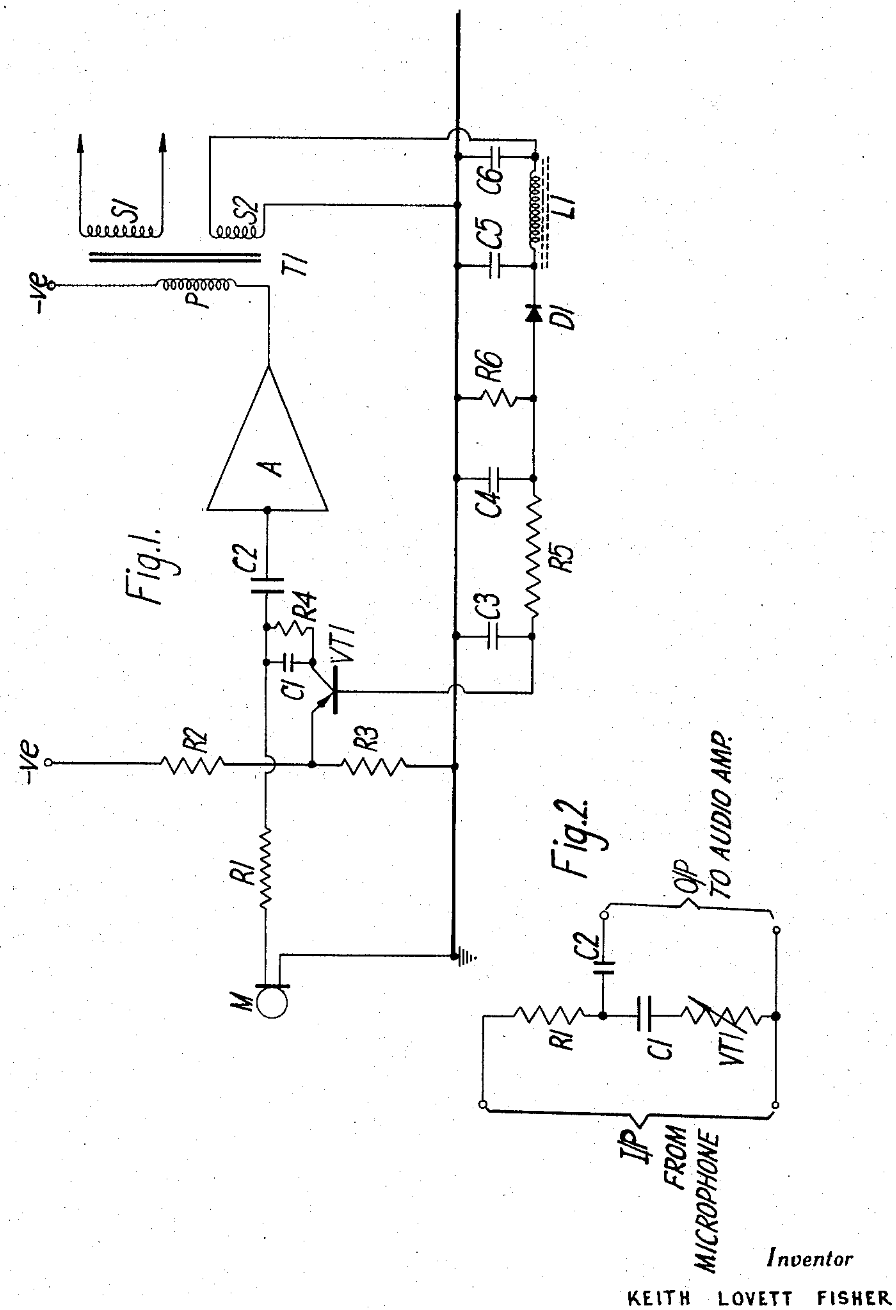

This invention relates to volume compression circuits, i.e. to circuits associated with an A.F. system and designed to be ineffective until an audio frequency signal reaches a permitted maximum amplitude whereupon the circuit operates to prevent that amplitude being exceeded notwithstanding any increase in the input of the system. Such circuits are used in sound radio transmitting equipment where the modulation signal must not exceed a permitted level (usually 90%).

The invention in one aspect is a volume compression circuit comprising an audio frequency amplifier in whose input circuits is a transistor which is normally biased to cut-off, but which on a predetermined volume being reached is rendered conductive to a degree dependent on the magnitude of a direct control potential derived from the output of the amplifier and proportional to the mean level of the audio frequency signals over a time which depends on the constants of the circuit.

The invention according to yet another aspect is a means for effecting volume compression at a modulation level in a radio transmitter in which a control signal is derived from the output of an A.F. amplifier for said modulation signal and used to control the impedance of a transistor in the amplifier input so that below a given level of modulation the transistor is cut off whereas when said level is reached the transistor is rendered conductive to a degree depending on the magnitude of the control signal.

The above and other features of the invention will be more readily understood by a perusal of the following description, having reference to the accompanying drawings in which FIGURE 1 is a circuit diagram of one form of the invention and FIGURE 2 is a diagram used to explain the operation of one section of FIGURE 1.

In FIGURE 1 an audio frequency signal from a microphone M is passed by way of resistor R1 and capacitor C2 to an audio amplifier A which may be a conventional multi-stage transistor amplifier. This amplifier is terminated in a transformer T1 which has a primary winding P connected to the amplifier and a secondary winding S1 from which is taken the audio signal for the modulation stage of a transmitter (not shown). A further secondary winding S2 is also provided and across which appears a small portion of the audio signal. This latter audio signal is fed by way of an R.F. filter comprising inductor L1 and capacitors C5 and C6 which removes any R.F. waves which may be fed back from the modulation stage, to a diode D1 which rectifies the audio signal. The resulting D.C. is filtered by the network comprising capacitors C3, C4 and resistors R5, R6, the latter component being included to modify the time constant present by the other three filter components so that the resulting D.C. level follows the variations in signal amplitude at the output of the audio amplifier. This varying D.C. level is applied to the base of transistor VT1, whose emitter is biased from the potential divider comprising resistors R2 and R3. This transistor is biased such that it will conduct only when there is applied to its base a negative D.C. level which is proportional to or greater than the audio level required to drive the modulator beyond the permitted modulation dept, (say 90%). The collector of transistor VT1 is connected by capacitor C1 to the line carrying the audio input signal, this capacitor being shunted by resistor R4 which prevents any charge building up across the capacitor.

Referring now to FIGURE 2 which shows the input circuit as seen by the incoming audio signal, transistor VT1 is represented as a variable impedance. When the incoming audio signal is such as to keep the modulation depth below 90%, transistor VT1 will be cut off as the negative potential at its base will be insufficient to overcome the potential at the emitter. The incoming signal will therefore be presented with a potential divider whose bottom leg is the transistor which is in its high impedance state and so virtually all the incoming signal is passed to the audio amplifier. If however the incoming audio signal is large enough to cause the modulation level to exceed 90%, the transistor VT1 will be made to conduct as the negative D.C. level will be greater than that at the emitter of the transistor, the degree of conduction being directly proportional to the excess of permissible modulation depth. The transistor therefore becomes an active member in the potential divider network (capacitor C1 being a short circuit to the A.C. signals) and a portion only of the incoming audio signal being passed to the audio amplifier so that the resulting output will not cause the modulation depth to exceed the maximum permissible level.

I claim:

A volume compression arrangement for an audio frequency amplifier having input and output circuits comprising a control circuit coupled between said input and output circuits, a transistor, means for connecting the transistor emitter electrode to a source of bias adapted normally to render the transistor at cut-off, means for applying to the transistor base electrode a direct control potential derived from the output of the amplifier, means for causing the transistor to conduct when the said control potential exceeds a predetermined amplitude, means for causing the degree of said conduction to depend on the magnitude of the control potential and a capacitor coupling the transistor collector electrode to the said input circuit and preventing the flow of direct current to the collector electrode of the transistor such as would reduce the sensitivity of the control circuit.

References Cited by the Examiner

UNITED STATES PATENTS

| | | | |
|---|---|---|---|
| 2,462,452 | 2/49 | Yates | 330—138 X |
| 3,019,396 | 1/62 | Heine et al. | 330—29 X |
| 3,117,287 | 1/64 | Damico | 330—29 X |

ROY LAKE, *Primary Examiner.*